US012538657B2

(12) United States Patent
Wen et al.

(10) Patent No.: US 12,538,657 B2
(45) Date of Patent: Jan. 27, 2026

(54) OLED DISPLAY SUBSTRATE AND METHOD FOR MAKING THE SAME, DISPLAY PANEL AND DISPLAY DEVICE

(71) Applicant: BOE Technology Group Co., Ltd., Beijing (CN)

(72) Inventors: Mengyang Wen, Beijing (CN); Xing Fan, Beijing (CN); Yueping Zuo, Beijing (CN); Chunyang Wang, Beijing (CN); Xiongnan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 791 days.

(21) Appl. No.: 17/798,160

(22) PCT Filed: May 17, 2021

(86) PCT No.: PCT/CN2021/094127
§ 371 (c)(1),
(2) Date: Aug. 8, 2022

(87) PCT Pub. No.: WO2021/249122
PCT Pub. Date: Dec. 16, 2021

(65) Prior Publication Data
US 2023/0106236 A1 Apr. 6, 2023

(30) Foreign Application Priority Data
Jun. 8, 2020 (CN) .......................... 202010511389.1

(51) Int. Cl.
H10K 59/122 (2023.01)
H10K 71/00 (2023.01)
H10K 59/12 (2023.01)

(52) U.S. Cl.
CPC .......... H10K 59/122 (2023.02); H10K 71/00 (2023.02); H10K 59/1201 (2023.02)

(58) Field of Classification Search
CPC .. H10K 59/122; H10K 71/00; H10K 59/1201; H10K 59/126; H10K 59/12; H10K 50/84
See application file for complete search history.

(56) References Cited

U.S. PATENT DOCUMENTS

2002/0140343 A1* 10/2002 Hirabayashi ......... H10K 59/126
313/493
2003/0020864 A1 1/2003 Yanagawa et al.
(Continued)

FOREIGN PATENT DOCUMENTS

CN 105765739 A * 7/2016 ........... H10H 20/853
CN 107819080 A 3/2018
(Continued)

OTHER PUBLICATIONS

Title: Polymer light emitting diode structure, manufacturing method, display substrate, and display device Images of Fig. 1 Cited for Reference Copy; Publication CN105765739A.Jul. 13, 2016; Inventor: Cui Ying; Hu Chunjing (Year: 2016).*
(Continued)

Primary Examiner — Fernando L Toledo
Assistant Examiner — Shawn Shaw Muslim
(74) Attorney, Agent, or Firm — IPro, PLLC

(57) ABSTRACT

An OLED display substrate and a method for making the same, a display panel and a display device are provided. The OLED display substrate includes: a base substrate; a thin-film transistor array layer located on the base substrate; a pixel definition layer and a light-emitting unit located on a side of the thin-film transistor array layer away from the base substrate; where the pixel definition layer defines a pixel opening penetrating the pixel definition layer, at least part of
(Continued)

the hierarchical structure of the light-emitting unit is located in the pixel opening, and a side surface of the pixel opening is provided with a insulative barrier layer.

12 Claims, 3 Drawing Sheets

(56) References Cited

U.S. PATENT DOCUMENTS

| 2017/0271419 A1 | 9/2017 | Cui et al. |
| 2019/0123116 A1 | 4/2019 | Wang et al. |

FOREIGN PATENT DOCUMENTS

| CN | 108511621 A | 9/2018 |
| CN | 109616499 A | 4/2019 |
| CN | 111310741 A | 6/2020 |
| CN | 111584590 A | 8/2020 |
| CN | 111584608 A | 8/2020 |

OTHER PUBLICATIONS

PCT/CN2021/094127 international search report and written opinion.

* cited by examiner

OLED DISPLAY SUBSTRATE AND METHOD FOR MAKING THE SAME, DISPLAY PANEL AND DISPLAY DEVICE

CROSS REFERENCE TO RELATED APPLICATIONS

This application is the U.S. national phase of PCT Application PCT/CN2021/094127 filed on May 17, 2021, which claims the priority to Chinese Patent Application No. 202010511389.1, filed in China on Jun. 8, 2020, which is incorporated herein by reference in its entirety.

TECHNICAL FIELD

The present disclosure relates to the display technical field, and in particular to an OLED display substrate and a method for making the same, a display panel and a display device.

BACKGROUND

Display device of the organic Light-Emitting Diode (OLED) has been listed as the next generation display technology with great development prospects due to its advantages of thinness, lightness, wide angle of view, active light-emitting, continuous and adjustable light-emitting color, low cost, fast response, low energy consumption, low driving voltage, wide operating temperature range, simple production process, high light efficiency rate and flexible display.

SUMMARY

In one aspect, an OLED display substrate is provided, including:

a base substrate;

a thin-film transistor array layer located on the base substrate;

a pixel definition layer and a light-emitting unit located on a side of the thin-film transistor array layer away from the base substrate;

where the pixel definition layer defines a pixel opening penetrating the pixel definition layer, at least part of the hierarchical structure of the light-emitting unit is located in the pixel opening, and a side surface of the pixel opening is provided with an insulative barrier layer.

In some embodiments, the insulative barrier layer uses an inorganic insulative material.

In some embodiments, the insulative barrier layer uses a light shielding material.

In some embodiments, the insulative barrier layer uses a molybdenum oxide.

In some embodiments, a side surface of the pixel definition layer away from the base substrate is provided with a light shielding layer.

In some embodiments, the light shielding layer includes a plurality of spaced light shielding graphics.

In some embodiments, the insulative barrier layer and the light shielding layer are arranged on the same layer and material.

In some embodiments, the insulative barrier layer is integral with the light shielding layer.

In some embodiments, the thicknesses of the insulative barrier layer is between 200 nm and 400 nm.

The embodiments of the present disclosure also provide a display panel, including the OLED display substrate as described above.

The embodiments of the present disclosure also provide a display device, including the OLED display substrate as described above.

The embodiments of the present disclosure also provide a method for making the OLED display substrate, including:

forming the thin-film transistor array layer on the base substrate;

forming the pixel definition layer on a side of the thin-film transistor array layer away from the base substrate, the pixel definition layer defining the pixel opening penetrating the pixel definition layer;

forming the insulative barrier layer on the side surface of the pixel opening; and forming a light-emitting unit in the pixel opening.

In some embodiments, the forming the insulative barrier layer on the side surface of the pixel opening includes:

forming the insulative barrier layer by using the light shielding material.

In some embodiments, the method further includes:

forming the light shielding layer on the side surface of the pixel definition layer away from the base substrate.

In some embodiments, the method further includes: forming a plurality of spaced light shielding graphics by performing a patterning process on the light shielding layer.

In some embodiments, the insulative barrier layer and the light shielding layer are formed simultaneously through one patterning process by using the light shielding material.

In some embodiments, prior to the forming the pixel definition layer on the side of the thin-film transistor array layer away from the base substrate, the method further includes:

forming a first electrode on a side of the thin-film transistor array layer away from the base substrate, the light-emitting unit including the first electrode;

where the forming the pixel definition layer on a side of the thin-film transistor array layer away from the base substrate includes:

forming the pixel definition layer on a side of the first electrode away from the base substrate;

the after forming the pixel definition layer on a side of the first electrode away from the base substrate, the method further including:

forming the light shielding material layer on the side surface of the pixel opening and a side of the pixel definition layer away from the base substrate, forming the insulative barrier layer covering the side surface of the pixel opening and a plurality of spaced light shielding graphics covering a side of the pixel definition layer away from the base substrate by performing the patterning process on the light shielding material layer.

DETAILED DESCRIPTION

In order to make the technical problems solved, the technical solutions and the advantages of the embodiments of the present disclosure clearer, a detailed description will be given below with reference to the drawings and specific embodiments.

In the related art, a pixel definition layer of an OLED display product is made by using an organic light barrier, and during the use of the OLED display product, if the OLED display product is irradiated with ultraviolet light, the pixel definition layer generates gas and erodes an organic functional layer, so that an edge of the organic functional layer is damaged and cannot emit light, thereby causing a pixel to shrink, affecting the display effect of the OLED display product.

Figure 1:
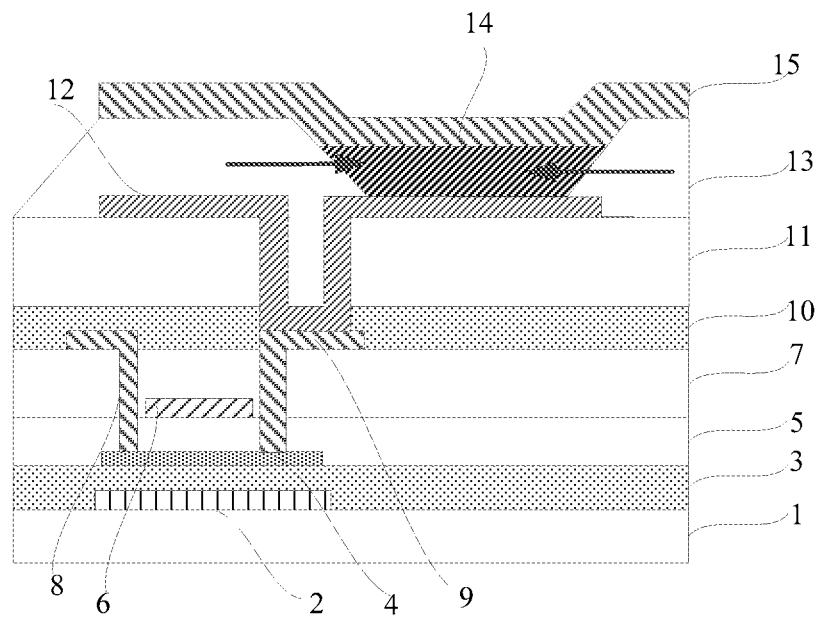
FIGS. 1 and 2 are structural diagrams of an OLED display substrate in some embodiments of the present disclosure.
Figure 2:
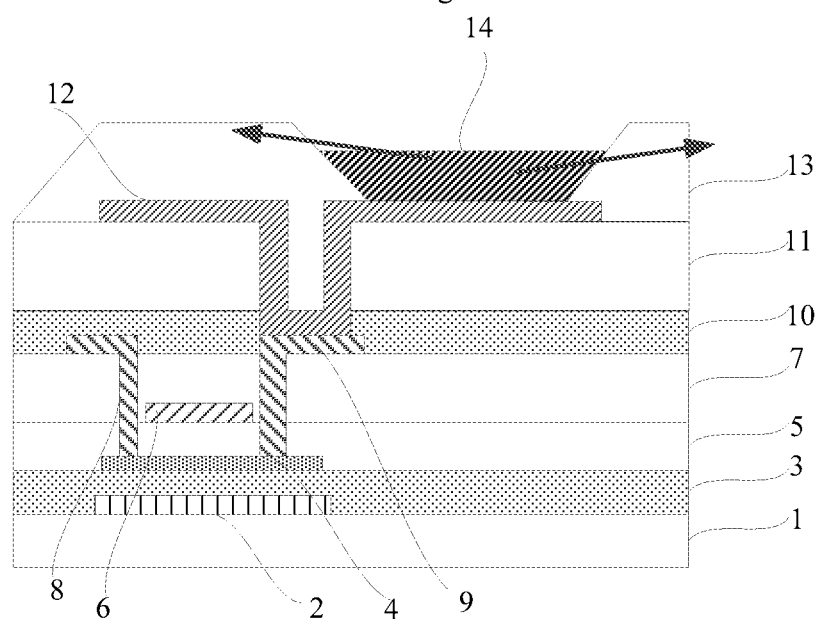

FIGS. 1 and 2 are structural diagrams of an OLED display substrate in some embodiments of the present disclosure. As shown in FIGS. 1 and 2, the OLED display substrate includes a thin-film transistor array layer on a base substrate 1, a pixel definition layer 13 and a light-emitting unit, where the light-emitting unit includes a first electrode 12, an organic functional layer 14 and a second electrode 15, and the pixel definition layer 13 is generally made of the organic light barrier. If the OLED display product is irradiated with ultraviolet light, the pixel definition layer 13 generates gas and erodes the organic functional layer 14, so that the edge of the organic functional layer 14 is damaged and cannot emit light, thereby causing the pixel to shrink, affecting the display effect of the OLED display substrate. In addition, as shown by the arrow in FIG. 2, since the pixel definition layer 13 is light-transmitting, light emitted from the organic functional layer 14 can also penetrate the pixel definition layer 13 to irradiate an adjacent pixel, and be emitted from an adjacent pixel edge, resulting in a stray light effect, so that the pixel edge light-emitting is blurred, further affecting the display effect of the OLED display substrate. Furthermore, the first electrode and a signal line are generally made of metal, and reflect external light, causing vertigo of the viewers so that the viewers cannot see the screen clearly. In order to reduce reflection, the related art generally attaches a polarizer on a light-exiting side of the OLED display substrate, and the thicknesses of the polarizer is generally large, 150 um-200 um, which not only increases the overall thicknesses of the display device, but also affects the light extraction efficiency of the OLED display substrate.

In view of the above-mentioned problems, the embodiments of the present disclosure provide an OLED display substrate and a method for making the same, a display panel and a display device, capable of ensuring the display effect of the OLED display substrate.

The embodiments of the present disclosure provide an OLED display substrate, including:
the base substrate;
the thin-film transistor array layer located on the base substrate;
the pixel definition layer and the light-emitting unit located on a side of the thin-film transistor array layer away from the base substrate;
where the pixel definition layer defines a pixel opening penetrating the pixel definition layer, at least part of the hierarchical structure of the light-emitting unit is located in the pixel opening, and a side surface of the pixel opening is provided with the insulative barrier layer.

In some embodiments, the light-emitting unit includes the first electrode, the organic functional layer, and the second electrode. In some embodiments, the organic functional layer and the second electrode of the light-emitting unit are arranged in the pixel opening. The pixel opening penetrates through the pixel definition layer, and as shown in FIGS. 3-6, the width of the pixel opening in the direction parallel to the base substrate gradually increases along the direction perpendicular to the base substrate. In some embodiments, the width of the pixel opening in the direction parallel to the base substrate is constant along the direction perpendicular to the base substrate.

As shown in FIGS. 3-6, the embodiments of the present disclosure provide an OLED display substrate, including:
the base substrate 1;
the thin-film transistor array layer on the base substrate 1;
a flat layer 11 located on a side of the thin-film transistor array layer away from the base substrate 1;
the first electrode 12 located on the flat layer 11;
the pixel definition layer 13 located at a side of the first electrode 12 away from the base substrate, the pixel definition layer defining the pixel opening;
the organic functional layer 14 and the second electrode (not shown) on the pixel opening;
where the side surface of the pixel opening is provided with the insulative barrier layer 16.

In the present embodiments, the insulative barrier layer is arranged on the side surface of the pixel opening, so that when the OLED display substrate is irradiated with ultraviolet light and the pixel definition layer generates gas during use or production, the insulative barrier layer can prevent the gas generated by the pixel definition layer from attacking the organic functional layer, protect the edge of the organic functional layer from being damaged, improve the problem of pixel shrinkage and ensure the display effect of the OLED display substrate.

Those skilled in the art would understand that the first electrode can be an anode, and the second electrode can be a cathode; it is also possible that the first electrode is the cathode and the second electrode is the anode.

The display substrate provided by the embodiments of the present disclosure may be of a top light-emitting type, in which case the first electrode close to the base substrate is in an opaque state and the second electrode away from the base substrate is in a transparent state. The display substrate may also be of a bottom light-emitting type, in which case the first electrode close to the base substrate is in the transparent state and the second electrode away from the base substrate is in the opaque state. The display substrate can of course also be of a double-sided light-emitting type, in which case both the first electrode close to the base substrate and the second electrode away from the base substrate are in the transparent state.

In the case where the first electrode or the second electrode is in the transparent state, the material of the first electrode or the second electrode may be, for example, ITO (Indium Tin Oxide), IZO (Indium Zinc Oxide) or IGZO (Indium Gallium Zinc Oxide), etc. In the case where the first electrode or the second electrode is in the opaque state, for example, the first electrode or the second electrode may include an ITO (Indium Tin Oxide) layer, an Ag (silver) layer and the ITO layer which are sequentially stacked.

The base substrate 1 may be a flexible substrate or a rigid substrate, and the rigid substrate may be a glass substrate or a quartz substrate.

The insulative barrier layer 16 should be an insulative material with stable properties under the irradiation of ultraviolet light. In some embodiments, the insulative barrier layer 16 can use an inorganic insulative material, such as Silicon nitride or silicon oxide. The inorganic insulative material has relatively stable properties under the irradiation of ultraviolet light, and does not generate gas; in addition, the inorganic insulative material is generally made of means of chemical deposition, so it has a relatively good density and can effectively block the gas generated by the pixel definition layer 13 from attacking the organic functional layer 14.

The organic functional layer 14 is generally located in the pixel opening defined by the pixel definition layer 13, and only contacts the side surface of the pixel opening; even if a part of the organic functional layer 14 is located on an upper surface of the pixel definition layer 13, this part of the organic functional layer 14 is not used for light-emitting, and does not affect the display of the OLED display substrate. Therefore, the insulative barrier layer 16 may be arranged only on the side surface of the pixel opening, that is, can effectively block the gas generated from the pixel definition layer 13 from attacking the organic functional layer 14. Of course, the insulative barrier layer 16 may also cover the upper surface of the pixel definition layer 13, namely, the surface of a side of the pixel definition layer 13 away from the base substrate 1. When the insulative barrier layer 16 covers the upper surface of the pixel definition layer 13, the insulative barrier layer 16 should not completely cover the upper surface of the pixel definition layer 13, so that the gas generated from the pixel definition layer 13 can escape at the region not covered with the insulative barrier layer 16.

Figure 3:
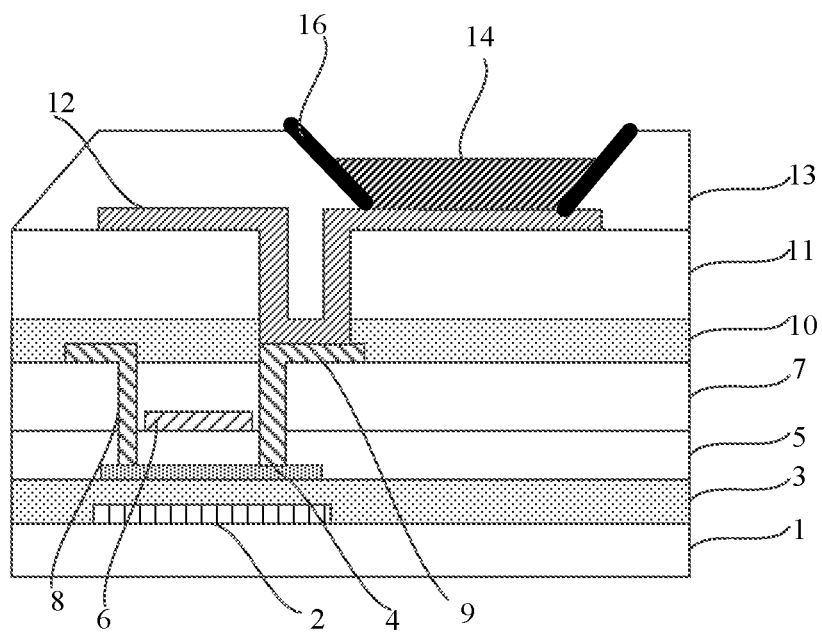
FIGS. 3 to 6 are structural diagrams of the embodiment OLED display substrate of the present disclosure.
Figure 4:
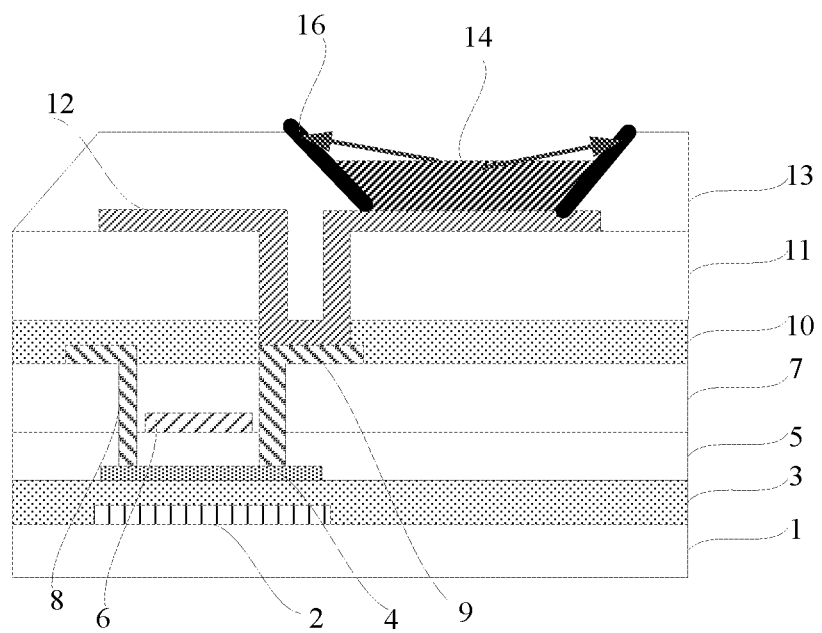

In some embodiments, the insulative barrier layer 16 can be light-shielding, as shown in FIG. 3, so that the insulative barrier layer 16 can also block light emitted from the organic functional layer 14 from penetrating the pixel definition layer 13 to the adjacent pixel and emitting from the adjacent pixel edge, so as to avoid causing the stray light effect to improve the clarity of the pixel edge and ensure the display effect of the OLED display substrate.

When the insulative barrier layer 16 is light-shielding, the insulative barrier layer 16 may use Silicon nitride or silicon oxide doped with light-shielding particles, and may also use light-shielding metal oxide, such as molybdenum oxide. Where the above-mentioned light-shielding particles include, but are not limited to, carbon black, carbon nanotubes and the like.

The thicknesses of the insulative barrier layer 16 is relatively small, and may be generally 200 nm -400 nm, so that even if the setting of the insulative barrier layer 16 is added in the OLED display substrate, the influence on the overall thicknesses of the OLED display substrate is small.

In some embodiments, the side surface of the pixel definition layer 13 away from the base substrate 1, namely, the upper surface of the pixel definition layer 13 is provided with a light shielding layer which absorbs the external light, and prevents the external light from being reflected by the electrode and the signal line impinging on the OLED display substrate to reduce the reflection of the external light by the OLED display substrate and ensure the display effect of the OLED display substrate.

In some embodiments, the light shielding layer includes a plurality of spaced light shielding graphics, namely, adjacent light shielding graphics are provided with a gap, so that the gas generated by the pixel definition layer 13 can escape at the gap between the adjacent light shielding graphics.

When the insulative barrier layer 16 is light-shielding, the insulative barrier layer 16 can be made of the same material as the light shielding layer, and thus the insulative barrier layer 16 and the light shielding layer can be made simultaneously by one patterning process; alternatively, the insulative barrier layer 16 is integral with the light shielding layer, and the thicknesses of the light shielding layer can be 200-400 nm, which is much smaller than the thicknesses of the polarizer, thus having little effect on the overall thicknesses of the display device. In addition, since the region where the upper surface of the pixel definition layer 13 is located is the spaced region between the pixels and is not used for display, the design of the light shielding layer does not affect the light extraction efficiency of the OLED display substrate.

The embodiments of the present disclosure also provide a display panel, including the OLED display substrate as described above.

The embodiments of the present disclosure also provide a display device, including the OLED display substrate as described above.

The display device includes, but is not limited to: a radio frequency cell, a network module, an audio output cell, an input cell, a sensor, a display cell, a user input unit, an interface unit, a memory, a processor, a power source, etc. It will be appreciated by those skilled in the art that the structure of the display device described above is not intended to be limiting of the display device, and that the display device may include more or less of the components described above, or some combinations of the components, or different arrangements of the components. In the embodiments of the present disclosure, the display device includes, but is not limited to, a monitor, a cell phone, a tablet, a television, a wearable electronic device, a navigation display device, etc.

The embodiments of the present disclosure also provide a method for making the OLED display substrate, including:
forming the thin-film transistor array layer on the base substrate;
forming the pixel definition layer on a side of the thin-film transistor array layer away from the base substrate, the pixel definition layer defining the pixel opening penetrating the pixel definition layer;
forming the insulative barrier layer on the side surface of the pixel opening; and
forming at least part of the hierarchical structure of the light-emitting unit in the pixel opening.

Specifically, as shown in FIGS. 3-6, the method for making the OLED display substrate includes:
forming the thin-film transistor array layer on the base substrate 1;
forming the flat layer 11 on a side of the thin-film transistor array layer away from the base substrate 1;
forming the first electrode 12 on the flat layer 11;
forming the pixel definition layer 13 on a side of the first electrode 12 away from the base substrate 1, the pixel definition layer 13 defining the pixel opening;
forming the insulative barrier layer 16 on the side surface of the pixel opening; and
forming the organic functional layer 14 and the second electrode on the pixel opening.

In the present embodiments, the insulative barrier layer is formed on a side surface of the pixel opening, so that when the OLED display substrate is irradiated with ultraviolet light and the pixel definition layer generates gas during use or production, the insulative barrier layer can avoid the gas generated by the pixel definition layer from attacking the organic functional layer, protect the edge of the organic functional layer from being damaged, improve the problem of pixel shrinkage and ensure the display effect of the OLED display substrate.

Those skilled in the art would understand that the first electrode can be an anode, and the second electrode can be a cathode; it is also possible that the first electrode is the cathode and the second electrode is the anode.

The display substrate provided by the embodiments of the present disclosure may be of the top light-emitting type, in which case the first electrode close to the base substrate is in the opaque state and the second electrode away from the base substrate is in the transparent state. The display substrate may also be of the bottom light-emitting type, in which case the first electrode close to the base substrate is in the transparent state and the second electrode away from the base substrate is in the opaque state. The display substrate can of course also be of the double-sided light-emitting type, in which case both the first electrode close to the base substrate and the second electrode away from the base substrate are in the transparent state.

In the case where the first electrode or the second electrode is in the transparent state, the material of the first electrode or the second electrode may be, for example, ITO, IZO or IGZO, etc. In the case where the first electrode or the second electrode is in the opaque state, the first electrode or the second electrode may include, for example, the ITO layer, the Ag layer, and the ITO layer which are sequentially stacked.

In some embodiments, the forming the insulative barrier layer on the side surface of the pixel opening includes:

forming the insulative barrier layer by using the light shielding material.

In this way, as shown in FIG. 3, the insulative barrier layer 16 can also block light emitted from the organic functional layer 14 from penetrating the pixel definition layer 13 to the adjacent pixel and emitting from the adjacent pixel edge, so as to avoid causing light efficiency to improve the clarity of the pixel edge and ensure the display effect of the OLED display substrate.

When the insulative barrier layer 16 is light-shielding, the insulative barrier layer 16 may use Silicon nitride or silicon oxide doped with light-shielding particles, and may also use light-shielding metal oxide, such as molybdenum oxide.

Where the above-mentioned light-shielding particles include, but are not limited to, carbon black, carbon nanotubes and the like.

The thicknesses of the insulative barrier layer 16 is relatively small, and may be generally 200 nm-400 nm, so that even if the setting of the insulative barrier layer 16 is added in the OLED display substrate, the influence on the overall thicknesses of the OLED display substrate is small.

In some embodiments, the method for making further includes:

forming the light shielding layer on the side surface of the pixel definition layer away from the base substrate.

Namely, the upper surface of the pixel definition layer 13 is provided with the light shielding layer which absorbs the external light, and prevents the external light from being reflected by the electrode and the signal line impinging on the OLED display substrate to reduce the reflection of the external light by the OLED display substrate and ensure the display effect of the OLED display substrate.

In some embodiments, the light shielding layer includes a plurality of spaced light shielding graphics, namely, adjacent light shielding graphics are provided with a gap, so that the gas generated by the pixel definition layer 13 can escape at the gap between the adjacent light shielding graphics.

In some embodiments, the method further includes: forming a plurality of spaced light shielding graphics by performing the patterning process on the light shielding layer.

When the insulative barrier layer 16 is light-shielding, the insulative barrier layer 16 can be made of the same material as the light shielding layer, and thus the insulative barrier layer 16 and the light shielding layer can be made simultaneously by one patterning process so that the manufacturing process of the OLED display substrate can be simplified.

In a specific embodiment, the method for making the OLED display substrate includes the following steps.

Figure 5:
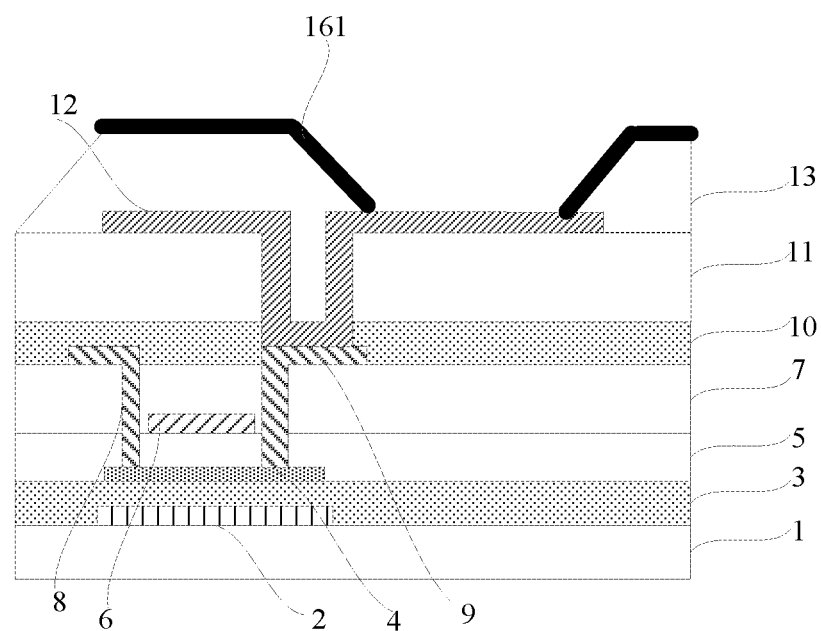

In step 1, as shown in FIG. 5, a light shielding metal layer 2, a buffer layer 3, a active layer 4, a gate insulating layer 5, a gate electrode 6, a interlayer insulating layer 7, a source electrode 8, a drain electrode 9, a passivation layer 10 and the flat layer 11 are formed on the base substrate 1;

where the base substrate 1 can be the glass substrate or the quartz substrate, and can also be the flexible base.

Specifically, the light shielding metal layer 2 with the thicknesses of about 500-4000 A can be deposited on the base substrate 1 by means of sputtering or thermal evaporation. The light shielding metal layer 2 can be the metal such as Cu, Al, Ag, Mo, Cr, Nd, Ni, Mn, Ti, Ta, W, etc. and an alloy of these metals, and the light shielding metal layer 2 can be a monolayer structure or a multilayer structure such as Cu\Mo, Ti\Cu\Ti, Mo\Al\Mo, etc. A layer of photoresist is coated on the light shielding metal layer, a mask plate is used to expose a photoresist, so that the photoresist forms the region which does not remain in the photoresist and the region which remains in the photoresist, where the region which remains in the photoresist corresponds to the region where the pattern of the light shielding metal layer is located, and the region which does not remain in the photoresist corresponds to the region except for the above-mentioned pattern; developing treatment is performed, the region which does not remain in the photoresist is completely removed, photoresist thicknesses of the region which remains in the photoresist remains unchanged; the light shielding metal layer of the region which does not remain in the photoresist is completely etched away by an etching process, and the remaining photoresist is stripped to form a pattern of the light shielding metal layer 2.

Thereafter, the buffer layer 3 with the thicknesses of 500 A-5000 A can be deposited on the base substrate 1 by using a Plasma Enhanced Chemical Vapor Deposition (PECVD) method, and the buffer layer 3 may be selected from oxide, nitride or oxynitride.

Thereafter, a layer of semiconductor material can be deposited on the buffer layer 3 to form the active layer 4.

Thereafter, the gate insulating layer 5 with the thicknesses of 500 A-5000 A can be deposited on the base substrate 1 by using the PECVD method, and the gate insulating layer 5 may be selected from oxide, nitride or oxynitride.

Thereafter, the gate metal layer 5 with the thicknesses of about 500 A-4000 A may be deposited on the gate insulating layer 5 by means of sputtering or thermal evaporation. The gate metal layer can be the metal such as Cu, Al, Ag, Mo, Cr, Nd, Ni, Mn, Ti, Ta and W, and an alloy of these metals, and the gate metal layer can be the monolayer structure or the multilayer structure, and the multilayer structure can be Cu\Mo, Ti\Cu\Ti, Mo\Al\Mo, etc. A layer of photoresist is coated on the gate metal layer, the mask plate is used to expose the photoresist, so that the photoresist forms the region which does not remain in the photoresist and the region which remains in the photoresist, where the region which remains in the photoresist corresponds to the region where the pattern of the gate metal layer is located, and the region which does not remain in the photoresist corresponds to the region except for the above-mentioned pattern; developing treatment is performed, the region which does not remain in the photoresist is completely removed, photoresist thicknesses of the region which remains in the photoresist remains unchanged; the gate metal layer of the region which does not remain in the photoresist is completely etched away by the etching process, and the remaining photoresist is stripped to form a pattern of the gate metal layer which includes the gate electrode 6.

Thereafter, the interlayer insulating layer 7 with the thicknesses of 500 A-5000 A can be deposited on the base substrate 1 by using the PECVD method, and the interlayer insulating layer 7 may be selected from oxide, nitride or oxynitride.

Thereafter, a source and drain electrode metal layer with the thicknesses of about 500 A-4000 A may be deposited on the interlayer insulating layer 7 by means of sputtering or thermal evaporation. The source and drain electrode metal layer can be the metal such as Cu, Al, Ag, Mo, Cr, Nd, Ni, Mn, Ti, Ta and W, and an alloy of these metals, and the source and drain electrode metal layer can be the monolayer structure or the multilayer structure, and the multilayer structure can be Cu\Mo, Ti\Cu\Ti, Mo\Al\Mo, etc. A layer of photoresist is coated on the source and drain electrode metal layer, the mask plate is used to expose the photoresist, so that the photoresist forms the region which does not remain in the photoresist and the region which remains in the photoresist, where the region which remains in the photoresist corresponds to the region where the pattern of the source and drain electrode metal layer is located, and the region which does not remain in the photoresist corresponds to the region except for the above-mentioned pattern; developing treatment is performed, the region which does not remain in the photoresist is completely removed, photoresist thicknesses of the region which remains in the photoresist remains unchanged; the source and drain electrode metal layer of the region which does not remain in the photoresist is completely etched away by the etching process, and the remaining photoresist is stripped to form a pattern of the source and drain electrode metal layer which includes the source electrode 8 and the drain electrode 9 that drive the thin-film transistor.

Thereafter, a layer of organic resin can be coated on the base substrate, the flat layer 11 is formed after being cured a pre-baking and post-baking process, and the flat layer 11 and a passivation layer 10 are patterned to form a through hole exposing the drain electrode 9.

In step 2, as shown in FIG. 5, the first electrode 12 is formed;

Specifically, the first electrode material layer can be formed on the flat layer 11, the photoresist is coated on the first electrode material layer, the photoresist is exposed and the region which remains in the photoresist and the region which is removed from the photoresist are formed after developing; the first electrode material layer of the region which is removed from the photoresist is etched and the remaining photoresist is stripped to form the first electrode 12. The first electrode material can use ITO, and the thicknesses is 120 nm; and the first electrode 12 is connected to the drain electrode 9 via the through hole penetrating the passivation layer 10 and the flat layer 11.

In step 3, as shown in FIG. 5, the pixel definition layer 13 is formed;

the pixel definition layer 13 can be formed by using the organic insulative material, the pixel definition layer 13 defining a plurality of pixel openings.

In step 4, as shown in FIG. 5, the light shielding material layer 161 covering the surface of the pixel definition layer 13 is formed;

The light shielding material layer 161 should be the insulative material with stable properties under the irradiation of ultraviolet light, such as Silicon nitride or silicon oxide, and the light shielding material layer can be formed by doping with light-shielding particles in the Silicon nitride or silicon oxide, where the light shielding particle includes but is not limited to carbon black, carbon nanotubes and the like; light shielding material layer 161 may also be a light-shielding metal oxide such as molybdenum oxide.

Figure 6:
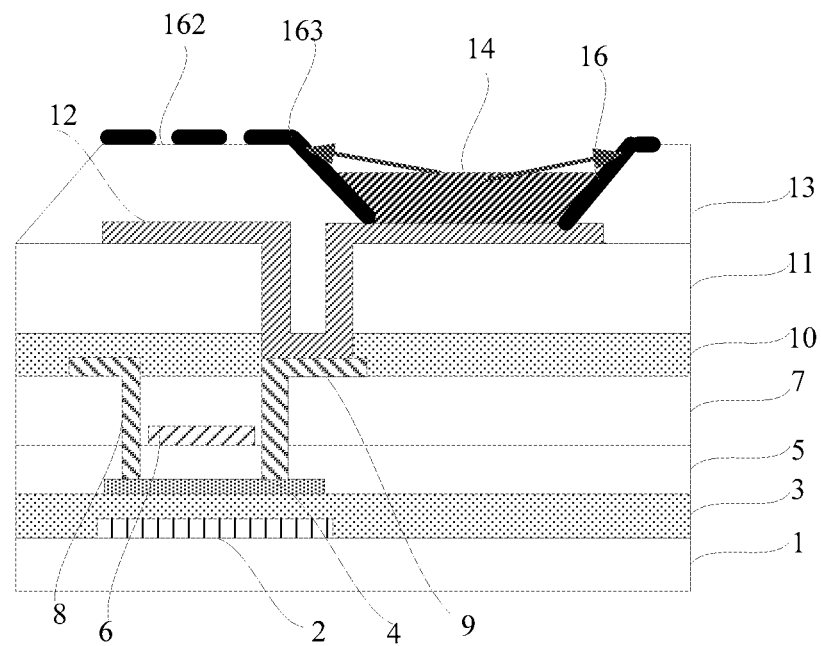

In step 5, as shown in FIG. 6, forming the insulative barrier layer 16 covering the side surface of the pixel definition layer 13 and a plurality of spaced light shielding graphics covering the upper surface of the pixel definition layer 13 by performing the patterning process on the light shielding material layer 161. An interval 162 is arranged between the adjacent light shielding graphics 163;

the insulative barrier layer 16 can effectively block the gas generated by the pixel definition layer 13 from attacking the organic functional layer 14; in addition, the insulative barrier layer 16 can also block light emitted from the organic functional layer 14 from penetrating the pixel definition layer 13 to the adjacent pixel and emitting from the adjacent pixel edge, so as to avoid causing the stray light effect to improve the clarity of the pixel edge and ensure the display effect of the OLED display substrate.

The light shielding graphic 163 absorbs the external light, and prevents the external light from being reflected by the electrode and the signal line impinging on the OLED display substrate to reduce the reflection of the external light by the OLED display substrate and ensure the display effect of the OLED display substrate. In addition, a gap is left between the adjacent light shielding graphics 163 so that the gas generated from the pixel definition layer 13 can escape at the gap 162 between the adjacent light shielding graphics 163.

In step 6, as shown in FIG. 6, the organic light emitting layer 14 is formed.

Specifically, the organic light emitting layer can be formed by an inkjet printing technique through the base substrate 1 in step 5.

Thereafter, structures like the second electrode, an encapsulation layer, etc. can also be formed, that is, the OLED display substrate of the present embodiment can be obtained.

In every embodiment of the present disclosure, the sequence number of each step cannot be used to define the sequence of each step, and for the ordinary skilled in the art, without involving any inventive effort, the sequence of each step is also within the protection range of the present disclosure.

It should be noted that every embodiment in this specification is described in a progressive manner, the same and similar parts between every embodiment can be referred to each other, and every embodiment focuses on the differences from other embodiment. In particular, for the embodiments, since they are substantially similar to the product embodiments, the description is relatively simple, and it is sufficient to refer to the partial description of the product embodiments.

Unless defined otherwise, technical or scientific terms used in this disclosure shall have the ordinary meaning as understood by the ordinary skilled in the art to which this disclosure belongs. The use of "first", "second", and the like in this disclosure does not denote any order, quantity, or importance, but rather is used to distinguish one element from another. The word "include" or "comprise", and the like, means that the presence of an element or item preceding the word covers the presence of the element or item listed after the word and equivalents thereof, but does not exclude other elements or items. "Connected" or "connection" and the like are not limited to physical or mechanical connections, but may include electrical connections, whether direct or indirect. The terms "upper", "lower", "left", "right", etc. are used only to indicate a relative position relationship, which may change accordingly when the absolute position of the object being described changes.

It will be understood that when an element such as a layer, film, region, or substrate is referred to as being "on" or "under" another element, it can be "directly on" or "directly under" the other element or intervening elements may be present.

In the above description of embodiments, particular features, structures, material or characteristics may be combined in any suitable manner in any one or more of the embodiments or examples.

The above description is only specific embodiments of the present disclosure, but the protection range of the present disclosure is not limited thereto, and those skilled in the art familiar with the present technical field can easily conceive changes or substitutions within the technical range disclosed in the present disclosure, and all should be included in the protection range of the present disclosure. Thus, the protection range of the present disclosure shall be subject to the protection range of the claims.

What is claimed is:

1. An OLED display substrate, comprising:
   a base substrate;
   a thin-film transistor array layer located on the base substrate;
   a pixel definition layer and a light-emitting unit located on a side of the thin-film transistor array layer away from the base substrate; and
   wherein the pixel definition layer defines a pixel opening penetrating the pixel definition layer, at least part of the hierarchical structure of the light-emitting unit is located in the pixel opening, and a side surface of the pixel opening is provided with an insulative barrier layer;
   wherein the side surface of the pixel definition layer away from the base substrate is provided with a light shielding layer;
   wherein the light shielding layer comprises a plurality of spaced light shielding graphics.

2. The OLED display substrate according to claim 1, wherein the insulative barrier layer uses an inorganic insulative material.

3. The OLED display substrate according to claim 2, wherein the insulative barrier layer uses a light shielding material.

4. The OLED display substrate according to claim 2, wherein the insulative barrier layer uses a molybdenum oxide.

5. The OLED display substrate according to claim 1, wherein the insulative barrier layer and the light shielding layer are arranged on the same layer and material.

6. The OLED display substrate according to claim 1, wherein the insulative barrier layer is integral with the light shielding layer.

7. The OLED display substrate according to claim 1, wherein the thickness of the insulative barrier layer is 200 nm-400 nm.

8. A display panel, comprising an OLED display substrate according to claim 1.

9. A display device, comprising an OLED display substrate according to claim 1.

10. A method for making an OLED display substrate, comprising:
    forming a thin-film transistor array layer on a base substrate;
    forming a pixel definition layer on a side of the thin-film transistor array layer away from the base substrate, the pixel definition layer defining a pixel opening penetrating the pixel definition layer;
    forming an insulative barrier layer on a side surface in the pixel opening; and
    forming at least part of the hierarchical structure of a light-emitting unit in the pixel opening;
    wherein the forming the insulative barrier layer on the side surface of the pixel opening comprises:
    forming the insulative barrier layer by using a light shielding material;
    wherein the method further comprises:
    forming the light shielding layer on the side surface of the pixel definition layer away from the base substrate;
    wherein the method further comprises: forming a plurality of spaced light shielding graphics by performing a patterning process on the light shielding layer.

11. The method for making the OLED display substrate according to claim 10, wherein the insulative barrier layer and the light shielding layer are simultaneously formed by one patterning process by using the light shielding material.

12. The method for making the OLED display substrate according to claim 10, wherein before the forming the pixel definition layer on a side of the thin-film transistor array layer away from the base substrate, the method further comprises:
    forming a first electrode on a side of the thin-film transistor array layer away from the base substrate, the light-emitting unit comprising the first electrode;
    wherein the forming the pixel definition layer on a side of the thin-film transistor array layer away from the base substrate comprises:
    forming the pixel definition layer on a side of the first electrode away from the base substrate; and
    the after forming the pixel definition layer on a side of the first electrode away from the base substrate, the method further comprising:
    forming the light shielding material layer on the side surface of the pixel opening and a side of the pixel definition layer away from the base substrate,
    forming the insulative barrier layer covering the side surface of the pixel opening and a plurality of spaced light shielding graphics covering a side of the pixel definition layer away from the base substrate by performing the patterning process on the light shielding material layer.

* * * * *